United States Patent
Takaku

(10) Patent No.: US 11,139,275 B2
(45) Date of Patent: Oct. 5, 2021

(54) SEMICONDUCTOR DEVICE AND METHOD OF MANUFACTURING THE SAME

(71) Applicant: KIOXIA CORPORATION, Tokyo (JP)

(72) Inventor: Satoru Takaku, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/799,004

(22) Filed: Feb. 24, 2020

(65) Prior Publication Data
US 2021/0020609 A1    Jan. 21, 2021

(30) Foreign Application Priority Data

Jul. 16, 2019  (JP) .............................. JP2019-130886

(51) Int. Cl.
*H01L 25/065* (2006.01)
*H01L 23/00* (2006.01)
*H01L 23/31* (2006.01)

(52) U.S. Cl.
CPC ...... *H01L 25/0657* (2013.01); *H01L 23/3107* (2013.01); *H01L 24/49* (2013.01); *H01L 2224/32145* (2013.01)

(58) Field of Classification Search
CPC .................. H01L 23/3135; H01L 25/0657
See application file for complete search history.

(56) References Cited

U.S. PATENT DOCUMENTS

| | | | |
|---|---|---|---|
| 9,024,424 B2 | 5/2015 | Yoshimura et al. | |
| 9,177,886 B2 | 11/2015 | Ko et al. | |
| 2013/0137217 A1* | 5/2013 | Kindo | H01L 21/561 438/109 |
| 2013/0256865 A1* | 10/2013 | Umeki | H01L 23/5389 257/690 |
| 2014/0070428 A1* | 3/2014 | Tanimoto | H01L 24/92 257/777 |
| 2014/0361411 A1* | 12/2014 | Yamamichi | H01L 21/561 257/621 |
| 2015/0061157 A1* | 3/2015 | Yu | H01L 25/50 257/777 |

FOREIGN PATENT DOCUMENTS

| | | |
|---|---|---|
| JP | 2015-176906 A | 10/2015 |
| JP | 2018-182125 A | 11/2018 |

* cited by examiner

*Primary Examiner* — Yu-Hsi D Sun
(74) *Attorney, Agent, or Firm* — Foley & Lardner LLP

(57) ABSTRACT

According to one embodiment, a semiconductor device includes a wiring board having a first surface. A first element is disposed on the first surface of the wiring board. A first resin layer covers the first element. A second element is larger than the first element and disposed on the first resin layer. The second element is superposed above the first element. A reinforcement member is disposed at a peripheral portion of the first resin layer and includes an edge disposed inside of the first resin layer. The reinforcement member has an upper surface above the first surface of the wiring board. The reinforcement member has a coefficient of linear expansion lower than the first resin layer. An encapsulating resin material, over the first surface of the wiring board, covers the first element, the second element, the first resin layer, and the reinforcement member.

16 Claims, 9 Drawing Sheets

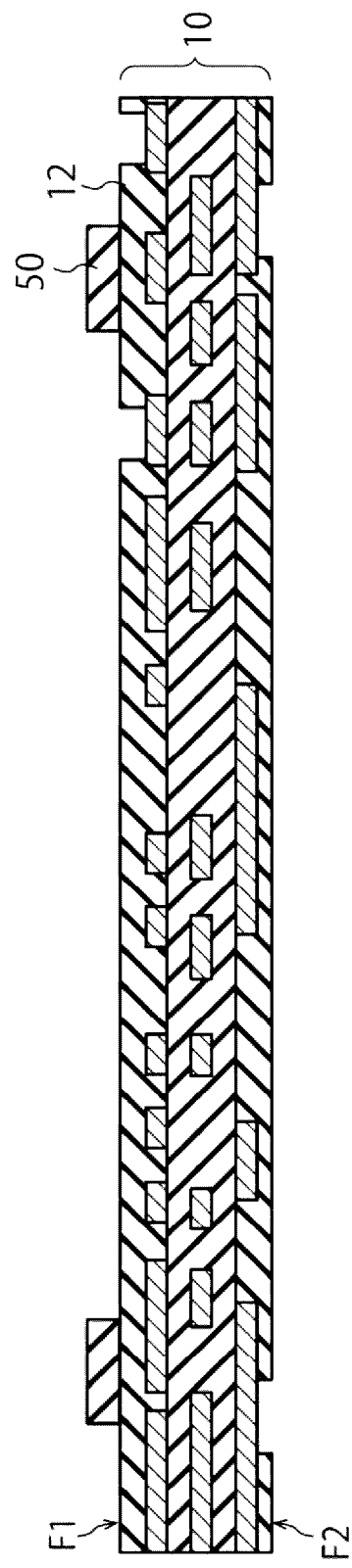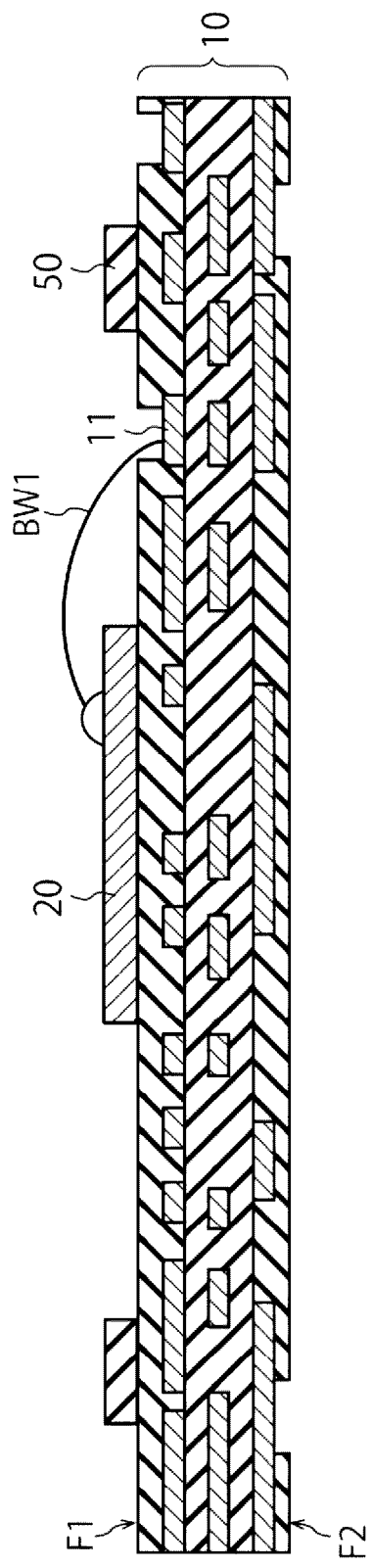

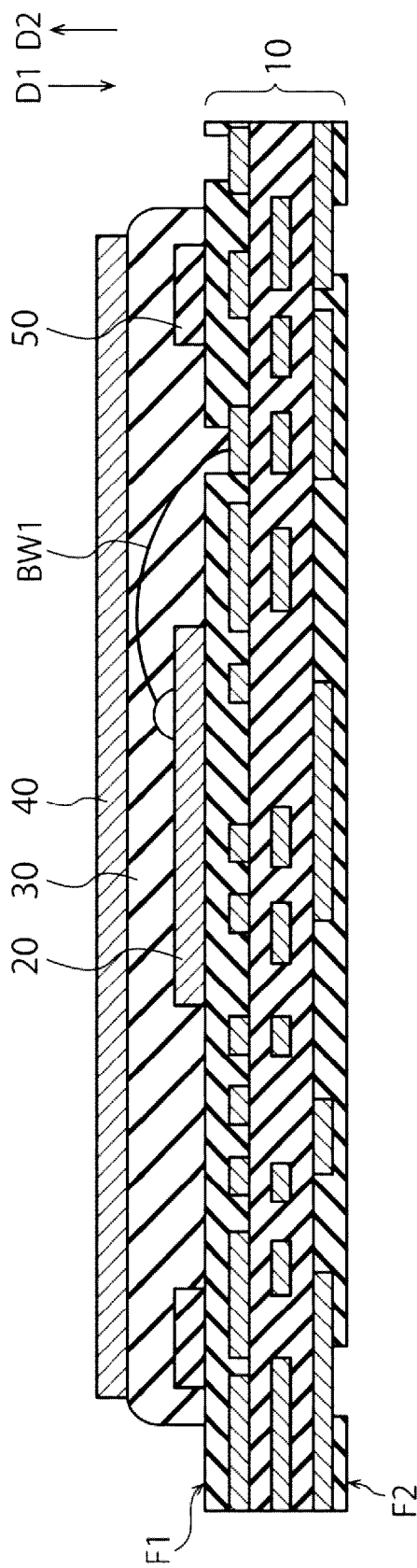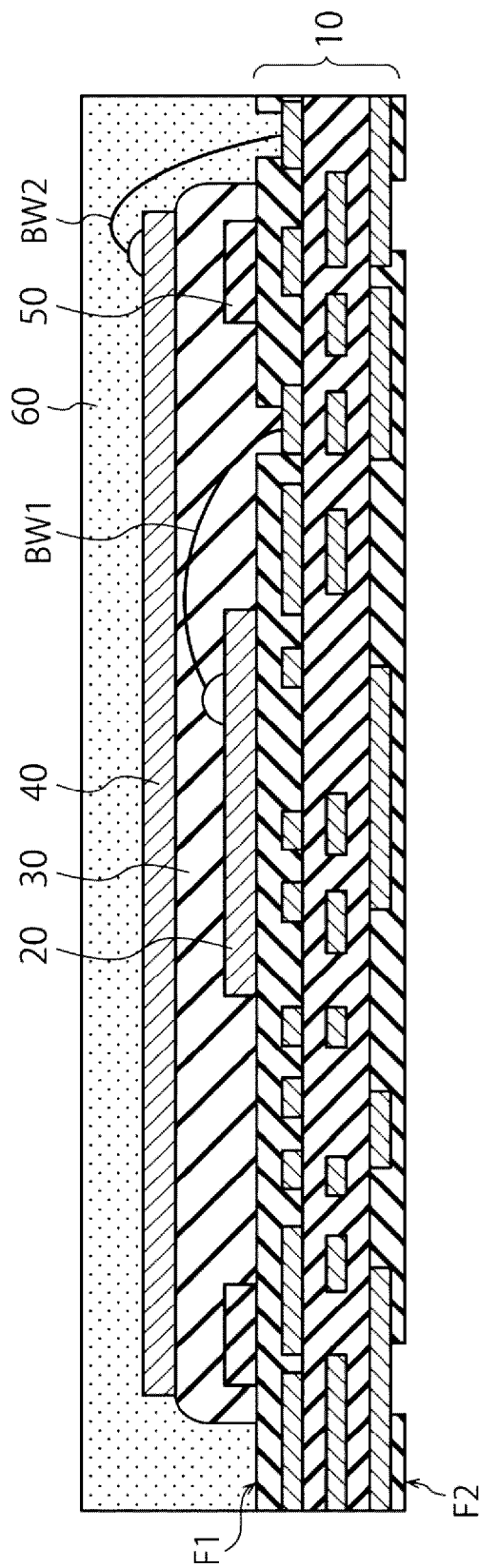

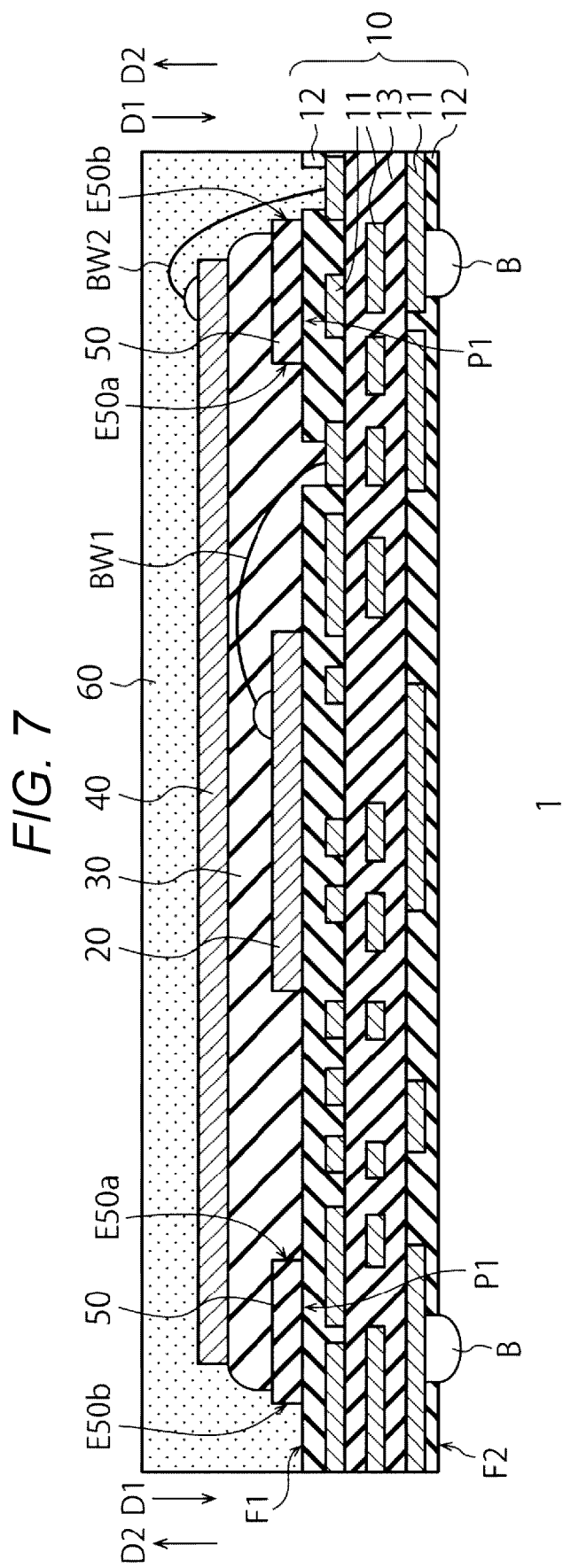

SEMICONDUCTOR DEVICE AND METHOD OF MANUFACTURING THE SAME

CROSS-REFERENCE TO RELATED APPLICATION

This application is based upon and claims the benefit of priority from. Japanese Patent Application No. 2019-130886, filed Jul. 16, 2019, the entire contents of which are incorporated herein by reference.

FIELD

Embodiments described herein relate generally to a semiconductor device and a method of manufacturing the same.

BACKGROUND

Recently, to promote size reduction and high-density integration of a semiconductor device, a plurality of semiconductor chips are stacked and encapsulated with resin into a single package, and such a package is being developed. The package is also used for a semiconductor memory, for example, in which a controller chip and a plurality of memory chips are stacked. In the semiconductor memory, in some cases, the controller chip relatively small is buried in a film material such as film on device (FOD), and the plurality of memory chips relatively large are stacked on the FOD.

In this case, in burying the controller chip, the FOD undergoes heating and compression processing between a wiring board and the memory chips. At this time, below a center portion of the memory chips, the controller chip exists and is buried in the FOD. Meanwhile, because the controller chip is not disposed below a peripheral portion of the memory chips, the peripheral portion of the memory chips is bent by compression. Moreover, because the FOD contracts when cooled, the FOD retracts inward from an outer edge of the memory chips in some cases. Due to the bending of the memory chips and the contraction of the FOD, stress is generated at the peripheral portion of the memory chips and causes a crack in a peripheral portion of the controller chip and its vicinity. For example, after the heating and compression processing, the peripheral portion of the controller chip is highly likely to be cracked on an occasion such as a temperature cycle test.

Examples of related art include JP-A-2015-176906.

DESCRIPTION OF THE DRAWINGS

FIGS. 5A and 5B are cross-sectional views illustrating the example of the method of manufacturing the semiconductor package that follows FIGS. 4A and 4B.

FIGS. 6A and 6B are cross-sectional views illustrating the example of the method of manufacturing the semiconductor package that follows FIGS. 5A and 5B.

FIG. 7 is a cross-sectional view of a semiconductor package according to a second embodiment, illustrating a configuration example thereof.

DETAILED DESCRIPTION

Figure 1:
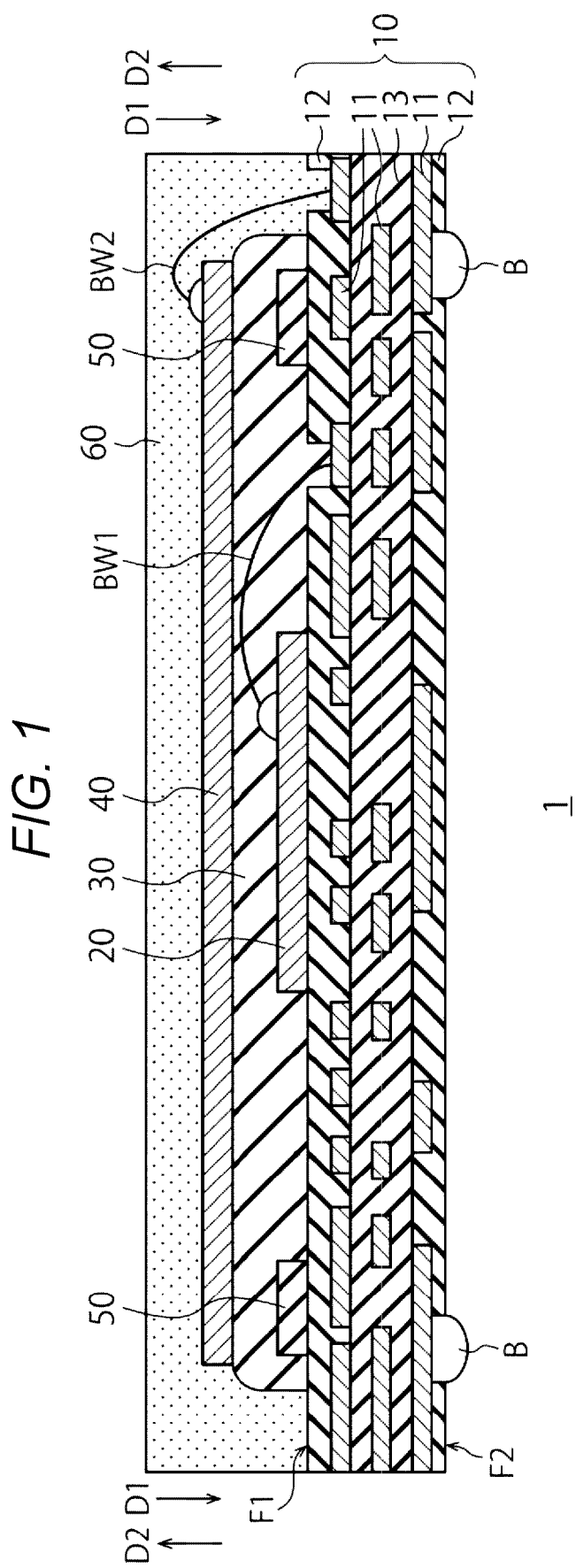
FIG. 1 is a cross-sectional view of a semiconductor package according to a first embodiment, illustrating a configuration example thereof.

Embodiments provide a semiconductor device and a method of manufacturing the same that effectively prevent a peripheral portion of a semiconductor chip from being cracked.

In general, according to one embodiment, a semiconductor device includes a wiring board having a first surface. A first element is disposed on the first surface of the wiring board. A first resin layer covers the first element. At least one second element is larger than the first element and disposed on the first resin layer. The at least one second element is superposed above the first element. A reinforcement member is disposed at a peripheral portion of the first resin layer and has at least one edge disposed inside of the first resin layer. The reinforcement member has an upper surface above the first surface of the wiring board. The reinforcement member has a first coefficient of linear expansion lower than a second coefficient of linear expansion of the first resin layer. An encapsulating resin material, over the first surface of the wiring board, that is configured to cover the first element, the at least one second element, the first resin layer, and the reinforcement member.

Hereinafter, embodiments of the present disclosure will be described with reference to the drawings. The embodiments do not limit the present disclosure. In the following embodiments, a vertical direction of a substrate refers to a relative direction when a surface of the substrate where semiconductor chips are disposed faces upward, and may be different from a vertical direction of gravitational acceleration in some cases. The drawings are schematic or conceptual diagrams, and ratios of portions, for example, are not necessarily the same as actual values. In the specification and the drawings, substantially the same components as already described with reference to preceding drawings are denoted with identical reference numerals and signs and will not be repeatedly elaborated.

First Embodiment

FIG. 1 is a cross-sectional view of a semiconductor package according to a first embodiment, illustrating a configuration example thereof. A semiconductor package 1 according to this embodiment is, for example, a semiconductor memory chip. This, however, should not be construed in a limiting sense. This embodiment is applicable to any stacked multi-chip package including a plurality of stacked semiconductor chips.

The semiconductor package 1 includes a wiring board 10, a controller chip 20 as the first element, a film on device (FOD) layer 30, a memory chip 40 as the second element, a reinforcement member 50, encapsulating resin 60, metal balls B, and bonding wires BW1 and BW2.

A plurality of wiring layers 11 and a plurality of insulating layers 12 and 13 are stacked to constitute the wiring board 10. The wiring layers 11 electrically connect the metal balls B to the controller chip 20 or the memory chip 40. The plurality of wiring layers 11 are made of a metal material such as copper. The insulating layers 12 and 13 cover a front surface and a rear surface of the wiring board 10, electrically insulate the wiring layers 11 from one another, and protect the wiring layers 11. The insulating layers 12 are partly removed to connect the bonding wires BW1 and BW2 to the wiring layers 11 and connect the metal balls B to the wiring layers 11. The insulating layers 12 and 13 are made of, for example, an insulative resin material, such as acrylic resin and epoxy resin, used as solder resist or photosensitive solder resist.

The controller chip 20 is disposed on a first surface F1 of the wiring board 10. The controller chip 20 includes a complementary metal-oxide-semiconductor (CMOS) circuit disposed on a semiconductor substrate and functions as a memory controller to control the memory chip 40. The controller chip 20 is adhered to the insulating layer 12 with an adhesive layer of die attachment film (DAF), for example. The DAF is adhesive at normal temperature, and thermally cures when heated to a predetermined temperature or higher. The controller chip 20 also includes an electrode pad and is electrically connected to part of the wiring layer 11 with the bonding wire BW1.

The FOD layer 30 as the first resin layer covers the controller chip 20 and the bonding wire BW1. In this embodiment, the FOD layer 30 also covers the whole reinforcement member 50. The FOD layer 30 is made of, for example, an insulative thermoplastic or thermosetting resin, such as acrylic resin, epoxy resin, and phenol resin. DAF thicker than the DAF for adhering the controller chip 20 to the insulating layer 12 may be used for the FOD layer 30. The FOD layer 30 is heated and pressed onto the controller chip 20 and the reinforcement member 50 so that the controller chip 20 and the reinforcement member 50 are buried in the FOD layer 30. Consequently, the FOD layer 30 in a region without the controller chip 20 and the reinforcement member 50 is relatively thick while the FOD layer 30 in regions where the controller chip 20 and the reinforcement member 50 are disposed is thinner by a thickness of the controller chip 20 or the reinforcement member 50.

The memory chip 40 has a plate shape and is disposed on the FOD layer 30 and superposed above the controller chip 20. The memory chip 40 is, for example, a NAND flash memory including a 3D memory cell array of memory cells disposed three-dimensionally. The memory chip 40 has a larger size than the controller chip 20. As viewed from the top, an outer edge of the memory chip 40 is outside of the controller chip 20 (see FIG. 2). In FIG. 1, the single memory chip 40 is illustrated. However, a plurality of memory chips 40 may be stacked on the FOD layer 30.

The reinforcement member 50 is disposed on the first surface F1 of the wiring board 10 and inside of the FOD layer at a peripheral portion of the FOD layer 30. The reinforcement member 50 protrudes from the first surface F1 and has an upper surface higher than the first surface F1. The reinforcement member 50 is made of a material having a lower coefficient of linear expansion than the FOD layer 30. For example, a material of the same kind as the insulating layers 12 (solder resist or photosensitive solder resist) or a resin material such as epoxy resin or a semiconductor material such as silicon is used for the reinforcement member 50. The reinforcement member 50 may be made of the same material as the insulating layer 12 on the first surface F1 of the wiring board 10. The reinforcement member 50 is disposed along an outer edge of the FOD layer 30 or the outer edge of the memory chip 40. Since the reinforcement member 50 has a lower coefficient of linear expansion than the FOD, the reinforcement member 50 relieves stress applied to a peripheral portion of the memory chip 40 after the heating and compression processing to bury the controller chip 20 in the FOD layer 30.

The encapsulating resin 60 covers the controller chip 20, the FOD layer 30, the memory chip 40, and the reinforcement member 50, for example, over the first surface F1 of the wiring board 10. A material such as thermosetting resin is used for the encapsulating resin 60.

The metal balls B are connected to part of the wiring layer 11 exposed from a second surface F2 of the wiring board 10. The metal balls B are made of a metal material such as solder.

The bonding wire BW1 connects the electrode pad of the controller chip 20 to an electrode pad of the wiring board 10. The bonding wire BW2 connects an electrode pad of the memory chip 40 to the electrode pad of the wiring board 10. The bonding wires BW1 and BW2 are made of, for example, a metal material such as gold.

Figure 2:
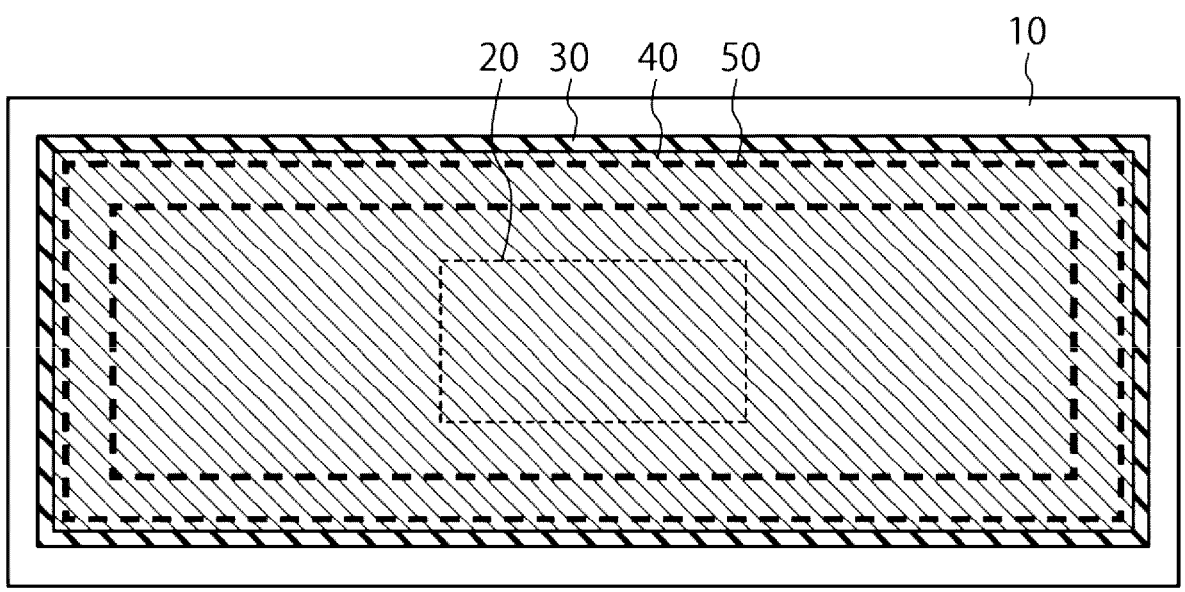
FIG. 2 is a schematic plan view of the semiconductor package according to the first embodiment, illustrating the configuration example thereof.

FIG. 2 is a schematic plan view of the semiconductor package according to the first embodiment, illustrating the configuration example thereof. That is, FIG. 2 illustrates the semiconductor package 1, as viewed from above the first surface F1. It is noted that the encapsulating resin 60 is omitted from FIG. 2, and that positions of the controller chip 20 and the reinforcement member 50 below the memory chip 40 are indicated with the dashed lines.

The memory chip 40 is superposed above the controller chip 20. The memory chip 40 and the controller chip 20 have rectangular shapes. Preferably, the center of the memory chip 40 substantially coincides with the center of the controller chip 20 to maintain symmetry of the semiconductor package 1. The memory chip 40 has a larger size than the controller chip 20, and the centers of the memory chip 40 and the controller chip 20 substantially coincide with each other so that the outer edge of the memory chip 40 is outside of an outer edge of the controller chip 20.

Under the memory chip 40, the FOD layer 30 covers the controller chip 20 and the reinforcement member 50. As illustrated in FIG. 2, the FOD layer 30 slightly protrudes from the outer edge of the memory chip 40 laterally (in directions substantially parallel to the first surface F1). That is, the outer edge of the FOD layer 30 is outside of the outer edge of the memory chip 40. This protrusion of the FOD layer 30 will be hereinafter also referred to as "bleed". The bleed is generated when the controller chip 20 and the reinforcement member 50 are buried to make the material of the FOD layer 30 protrude from the outer edge of the memory chip 40. It is noted that conversely, there are cases where the FOD layer 30 retracts (is recessed or depressed) toward the center from the outer edge of the memory chip 40. Although the bleed of the FOD layer 30 is controllable to some extent, it is difficult to control a degree of such retraction. In view of this, the FOD layer 30 is made to slightly protrude from the outer edge of the memory chip 40.

As viewed from above the first surface F1, the reinforcement member 50 has a substantially rectangular frame shape and is inside the outer edges of the memory chip 40 and the FOD layer 30. The reinforcement member 50 is buried in the FOD layer 30, e.g., not exposed by the FOD layer 30. The reinforcement member 50 is disposed continuously along the entire outer edges of the memory chip 40 and the FOD layer 30. The reinforcement member 50 has such a configuration and functions as follows.

When the controller chip 20 and the reinforcement member 50 are buried, the FOD layer 30 is heated and compressed substantially vertically toward the first surface F1 between the wiring board 10 or the controller chip 20 and the memory chip 40. At this time, the FOD layer 30 flows to cover and make the controller chip 20 and the reinforcement member 50 buried.

Suppose that no reinforcement member 50 is provided. The controller chip 20 is disposed between a center portion of the memory chip 40 and the wiring board 10 whereas only the FOD layer 30 exists between a peripheral portion of the memory chip 40 and the wiring board 10. Therefore, as a result of heating and compression, the peripheral portion of the memory chip 40 is more likely to be pressed and bent toward the wiring board 10 (in the direction D1 in FIG. 1) than the center portion of the memory chip 40 is. In this case, after the heating and compression processing, when the compression is stopped and cooling is started, the peripheral portion of the memory chip 40 rebounds away from the wiring board 10 (in the direction D2 in FIG. 1) so that stress is applied to the peripheral portion of the memory chip 40. When the peripheral portion of the memory chip 40 rebounds in the direction D2 and the FOD layer 30 contracts by cooling, the FOD layer 30 is more likely to retract at the outer edge of the memory chip 40 and applies relatively large stress to the peripheral portion of the memory chip 40. Consequently, at the peripheral portion of the memory chip 40, the memory chip 40, the FOD layer 30, and the wiring board 10 become more likely to be cracked.

In contrast, according to this embodiment, the reinforcement member 50 is disposed in the FOD layer 30 and below the peripheral portion of the memory chip 40. Therefore, by the heating and compression, the memory chip 40 is pressed in the direction D1 while maintaining a substantially plane state as a whole. In this case, because the peripheral portion of the memory chip 40 is not bent, rebounding force of the peripheral portion of the memory chip 40 to return in the direction D2 after the heating and compression processing is relatively small. This makes stress applied to the peripheral portion of the memory chip 40 relatively small. Although the FOD layer 30 contracts by cooling, rebounding force of the peripheral portion of the memory chip 40 to return in the direction D2 is small. This makes the FOD layer 30 less likely to retract from the outer edge of the memory chip 40. Thus, the peripheral portion of the memory chip 40 is prevented from being cracked.

(Thickness of Reinforcement Member 50) When the reinforcement member 50 has too small a thickness (i.e., a height from the first surface F1 to an upper surface of the reinforcement member 50), the peripheral portion of the memory chip 40 is pressed in the direction D1 in the heating and compression processing in a similar manner to the case where no reinforcement member 50 is provided. Therefore, preferably, the thickness of the reinforcement member 50 is substantially equal to or larger than a thickness of the controller chip 20. "Substantially equal" means not only that the thickness of the reinforcement member 50 is equal to the thickness of the controller chip 20 but also that the thickness of the reinforcement member 50 is slightly smaller and slightly larger than the thickness of the controller chip 20. When the reinforcement member 50 is too thick, the memory chip 40 comes into contact with the reinforcement member 50. This makes it necessary to make the thickness of the reinforcement member 50 smaller than a thickness of the FOD layer 30. That is, preferably, the thickness of the reinforcement member 50 is in a range from a value substantially equal to the thickness of the controller chip 20 to the thickness of the FOD layer 30.

Figure 3:
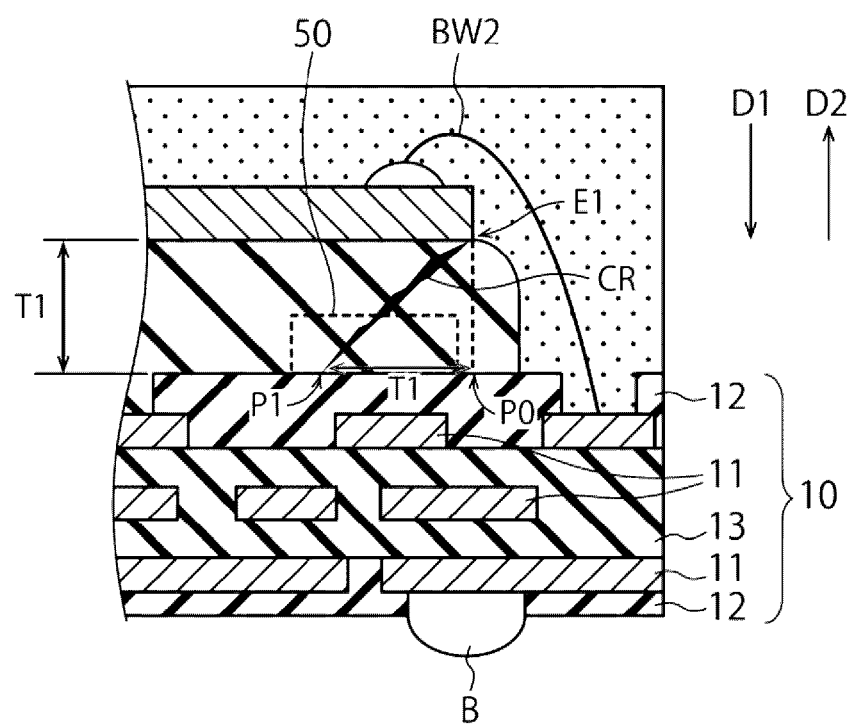
FIG. 3 is an enlarged cross-sectional view of peripheral portions of an FOD layer and a memory chip illustrated in FIG. 1.

(Position of Reinforcement Member 50) FIG. 3 is an enlarged cross-sectional view of the peripheral portions of the FOD layer 30 and the memory chip 40 illustrated in FIG. 1. In FIG. 3, the reinforcement member 50 is indicated with the dashed line for convenience. Reference sign CR denotes a crack. As illustrated in FIG. 3, the crack CR spreads diagonally inward from an outer edge μl of the memory chip 40 that lies between the FOD layer 30 and the memory chip 40. An inclination angle (an angle with respect to the vertical direction) of the crack CR is not necessarily constant but is approximately 45 degrees in many cases. Reference sign P0 denotes a position on the first surface F1 corresponding to the outer edge μl of the memory chip 40. Reference sign P1 denotes a position displaced from the position P0 toward the controller chip 20 by a distance substantially equal to the thickness T1 of the FOD layer 30. At this time, the crack CR runs from the outer edge E1 of the memory chip 40 and passes by the vicinity of the position P1 in many cases. Further, from the vicinity of the position P1, the crack CR spreads into the wiring board 10 or along the interface of the first surface F1.

In view of this, the reinforcement member 50 according to this embodiment is disposed on and close to the position (the first position) P1 displaced from the position P0 toward the controller chip 20 by a distance substantially equal to the thickness T1 of the FOD layer 30. An inner edge of the reinforcement member 50 is between the first position P1 and the controller chip 20 and inside of the FOD layer 30. An outer edge of the reinforcement member 50 is between the first position P1 and the outer edge of the FOD layer 30 or the position P0 and inside of the FOD layer 30. Thus, as illustrated in FIG. 3, the reinforcement member 50 is disposed in the position where the crack CR passes so as to prevent the crack CR from spreading. As described above, the reinforcement member 50 can eliminate or minimize stress applied to the peripheral portion of the memory chip 40 to prevent generation of the crack CR, and even when the crack CR is generated, the reinforcement member 50 can prevent the crack CR from spreading.

Next, a method of manufacturing the semiconductor package 1 will be described.

Figure 4A:
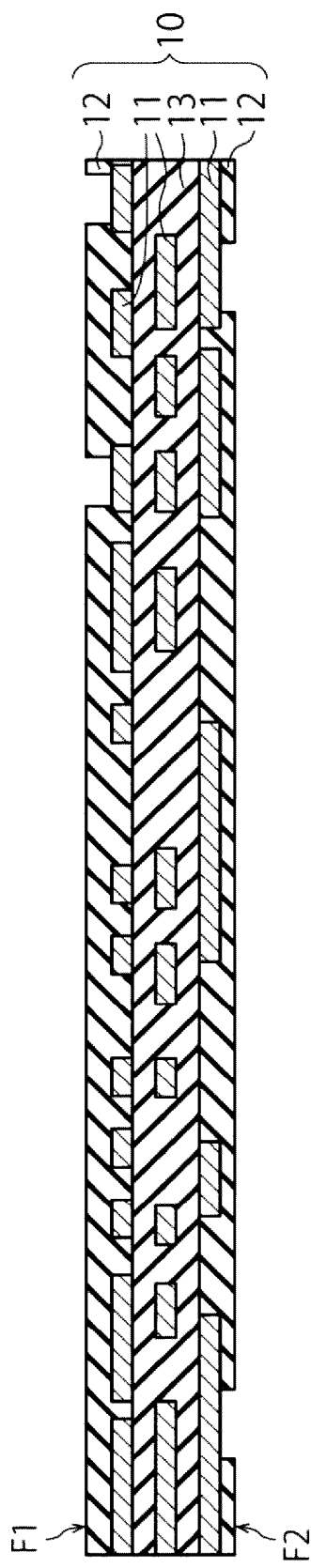
FIGS. 4A and 4B are cross-sectional views illustrating an example of a method of manufacturing the semiconductor package according to the first embodiment.

FIGS. 4A to 6B are cross-sectional views illustrating an example of the method of manufacturing the semiconductor package according to the first embodiment. First, as illustrated in FIG. 4A, the wiring board 10 is provided. The wiring board 10 includes the plurality of wiring layers 11 and the insulating layers 12 and 13 covering the wiring layers 11.

Figure 4B:
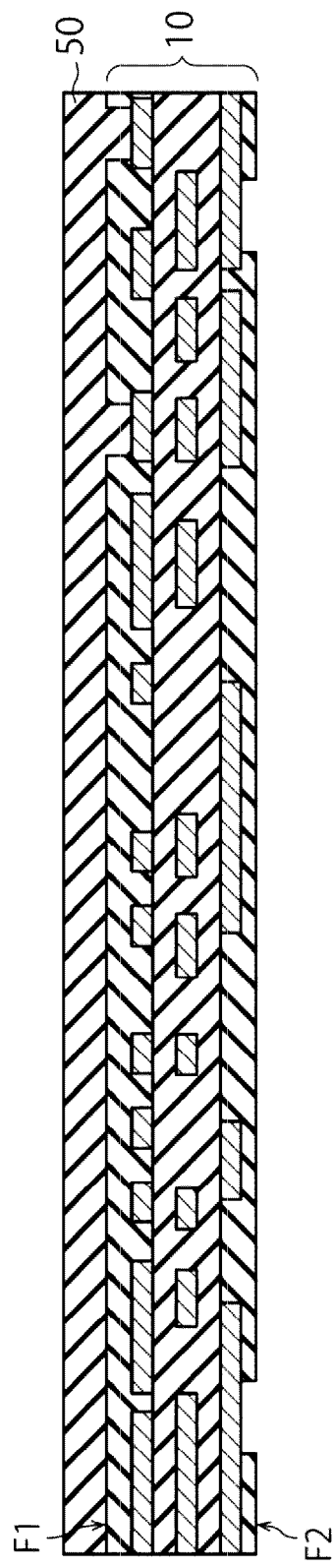

Next, as illustrated in FIG. 4B, the material of the reinforcement member 50 is deposited on the first surface F1 of the wiring board 10 to a level higher than the first surface F1.

Next, as illustrated in FIG. 5A, the reinforcement member 50 is processed using lithography and etching techniques. The reinforcement member 50 is disposed at a position that surrounds the controller chip 20 to be adhered to the wiring board 10 later and that corresponds to the peripheral portion of the memory chip 40 to be adhered onto the FOD layer 30. The reinforcement member 50 is processed into a substantially rectangular frame shape (see FIG. 2). When the reinforcement member 50 is made of photosensitive solder resist, for example, the reinforcement member 50 can be formed by the lithography technique in which the reinforcement member 50 undergoes light exposure and development in the above-described pattern. Alternatively, when the reinforcement member 50 is made of non-photosensitive solder resist, for example, photoresist (not illustrated) is applied to the reinforcement member 50 by the lithography technique, and the photoresist is processed into the above-described pattern. Thereafter, using the photoresist as a mask, the reinforcement member 50 may be processed by the etching technique. Thus, the reinforcement member 50 is processed into the above-described pattern.

Next, as illustrated in FIG. 5B, the controller chip 20 is adhered to the first surface F1 of the wiring board 10. The controller chip 20 is adhered to a center portion of the wiring board 10 with the DAF (not illustrated), for example. The controller chip 20 is disposed inside of the frame of the reinforcement member 50, and preferably, the controller chip 20 is disposed in the center of the frame of the reinforcement member 50. That is, preferably, the center of the controller chip 20 substantially coincides with the center of the frame of the reinforcement member 50. Next, the bonding wire BW1 is connected between the electrode pad of the controller chip 20 and part of the wiring layer 11 of the wiring board 10.

Next, as illustrated in FIG. 6A, the FOD layer 30 is disposed on the controller chip 20, the reinforcement member 50, and the bonding wire BW1, and the memory chip 40 is disposed on the FOD layer 30. The memory chip 40 is larger than the controller chip 20 and is superposed above the controller chip 20. The memory chip 40 is disposed in such a manner that the reinforcement member 50 extends along the peripheral portion of the memory chip 40. A stacked body of a plurality of memory chips 40 may be mounted on the FOD layer 30. Preferably, the center of the memory chip 40 substantially coincides with the center of the controller chip 20 and the center of the frame of the reinforcement member 50.

Next, the heating and compression processing is performed. While the FOD layer 30 is heated between the wiring board 10 and the memory chip 40, the wiring board 10 and the memory chip 40 are pressed toward each other (in the directions D1 and D2). Thus, the FOD layer 30 is softened, and as illustrated in FIG. 6A, the controller chip 20, the reinforcement member 50, and the bonding wire BW1 are buried in the FOD layer 30. In this embodiment, the whole reinforcement member 50 is buried in the FOD layer 30.

When the memory chip 40 is pressed in the direction D1, the controller chip 20 is disposed below the center portion of the memory chip 40, and the reinforcement member 50 is disposed below the peripheral portion of the memory chip 40. Consequently, the memory chip 40 is compressed while maintaining a substantially plane state to prevent the peripheral portion of the memory chip 40 from being bent in the direction D2. As a result, after the heating and compression processing, stress applied to the peripheral portion of the memory chip 40 becomes relatively small. Although the FOD layer 30 contracts by cooling, rebound force of the peripheral portion of the memory chip 40 to return in the direction D2 is so small that the FOD layer 30 becomes less likely to retract from the outer edge of the memory chip 40. That is, side surfaces of the memory chip 40 become less likely to be recessed inward along the first surface F1 of the wiring board 10. This prevents the peripheral portion of the memory chip 40 from being cracked.

Since the reinforcement member 50 is disposed below the peripheral portion of the memory chip 40, the FOD layer 30 is more likely to protrude (bleed) from the outer edge of the memory chip 40. When the FOD layer 30 retracts, it is difficult to control a degree of retraction (a depth of recess or depression). In contrast, when the FOD layer 30 protrudes from the outer edge of the memory chip 40, it is relatively easy to control a degree of protrusion (an amount of bleed). Therefore, the reinforcement member 50 disposed below the peripheral portion of the memory chip 40 facilitates control of the outer edge (side surfaces) of the FOD layer 30 at the outer edge of the memory chip 40.

Next, as illustrated in FIG. 6B, the bonding wire BW2 is connected between the electrode pad of the memory chip 40 and part of the wiring layer 11 of the wiring board 10. Furthermore, the controller chip 20, the FOD layer 30, the memory chip 40, and the reinforcement member 50, for example, are covered with the encapsulating resin 60 over the first surface F1 of the wiring board 10.

Thereafter, the metal balls B are formed on portions of the wiring layer 11 that are exposed from the second surface F2 of the wiring board 10. This completes the semiconductor package 1 illustrated in FIG. 1.

According to this embodiment, in the heating and compression processing, the memory chip 40 is pressed while maintaining a substantially plane state as a whole.

Consequently, the peripheral portion of the memory chip 40 is not bent in the direction D1, and after the heating and compression processing, rebound force of the peripheral portion of the memory chip 40 to return in the direction D2 becomes relatively small. This makes stress applied to the peripheral portion of the memory chip 40 relatively small, thereby preventing the peripheral portion of the memory chip 40 from being cracked. With the rebound force of the peripheral portion of the memory chip 40 being decreased, the reinforcement member 50 substantially increases the height of the first surface F1 below the peripheral portion of the memory chip 40. With this configuration, the FOD layer 30 is relatively likely to bleed from the outer edge of the memory chip 40 and less likely to retract. As a result, at the peripheral portion of the memory chip 40, the FOD layer 30 can be controlled relatively easily to prevent cracks effectively.

Second Embodiment

FIG. 7 is a cross-sectional view of a semiconductor package 2 according to a second embodiment, illustrating a configuration example thereof. According to the second embodiment, part of the reinforcement member 50 is exposed by the outer edge (side surfaces) of the FOD layer 30. That is, one edge E50a of the reinforcement member 50 is between the first position P1 and the controller chip 20 and inside of the FOD layer 30 whereas the other edge E50b is outside of the outer edge of the FOD layer 30. In other words, the outer edge of the FOD layer 30 is on a surface of the reinforcement member 50. The rest of the configuration of the second embodiment may be substantially the same as the corresponding configuration of the first embodiment.

With the reinforcement member 50 protruding from the outer edge of the FOD layer 30, the FOD layer 30 is even more likely to bleed from the outer edge of the memory chip 40 in the heating and compression processing. This can prevent the FOD layer 30 from retracting, thus more effectively preventing the peripheral portion of the memory chip 40 from being cracked.

The reinforcement member 50 according to the second embodiment can be formed by changing the photomask pattern of the lithography technique in FIG. 5A. The rest of the manufacturing process of the second embodiment may be substantially the same as the corresponding manufacturing process of the first embodiment.

Figure 8:
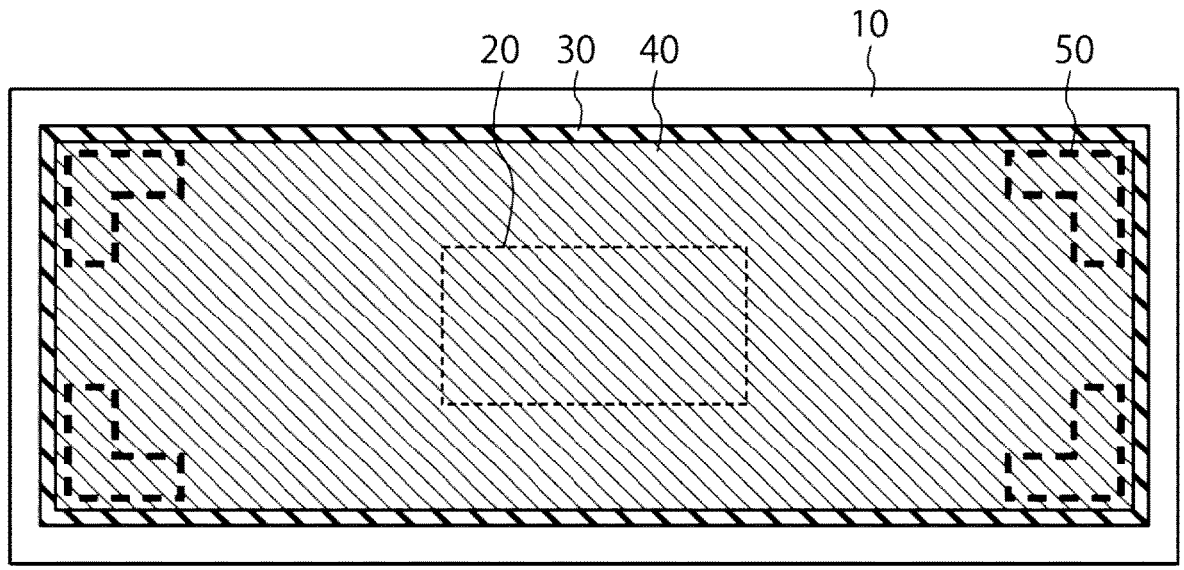
FIG. 8 is a plan view illustrating a modification of a reinforcement member.
Figure 9:
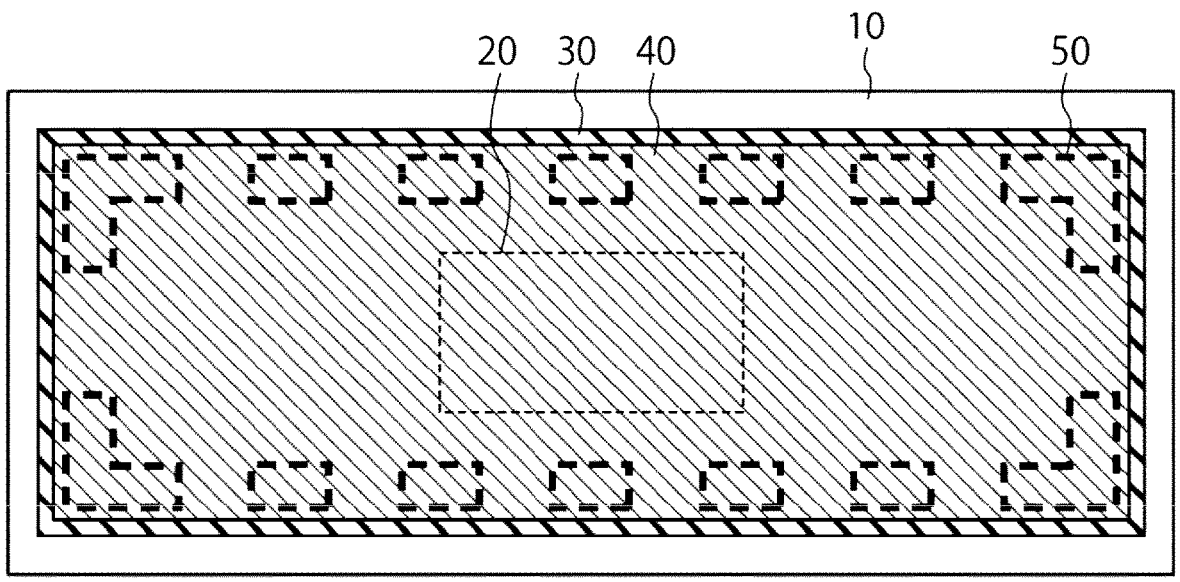
FIG. 9 is a plan view illustrating a modification of the reinforcement member.
Figure 10:
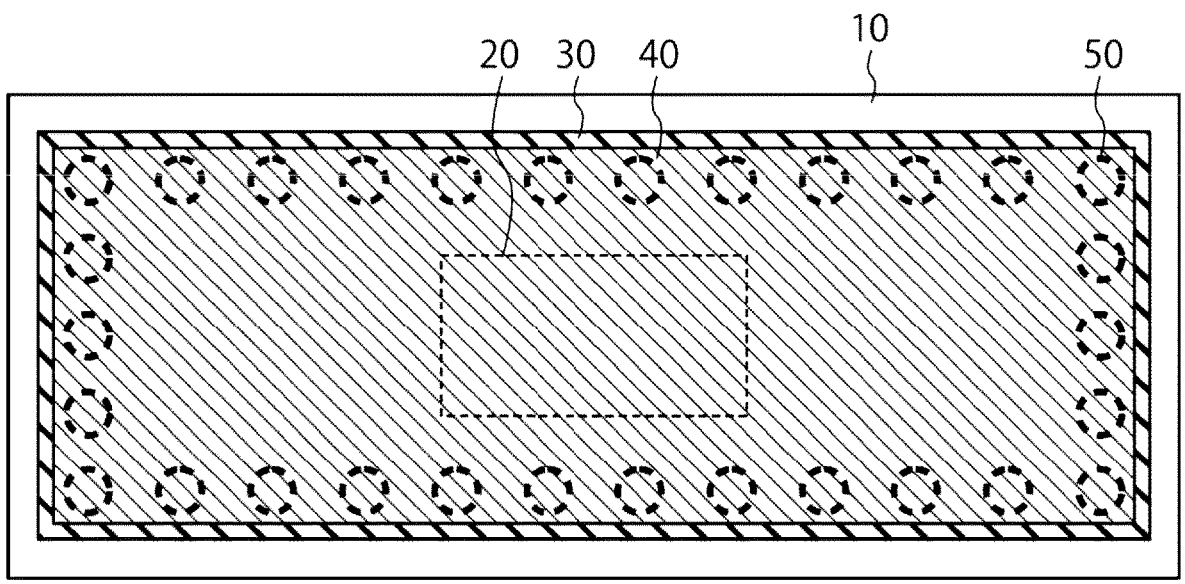
FIG. 10 is a plan view illustrating a modification of the reinforcement member.

(First Modification) FIGS. 8 to 10 are schematic plan views illustrating modifications of the reinforcement member 50. FIGS. 8 to 10 illustrate the semiconductor package 1, as viewed from above the first surface F1.

In FIG. 8, the reinforcement members 50 are disposed at four corners of the memory chip 40 and the FOD layer 30, and are not disposed along side portions (sides) of the memory chip 40 and the FOD layer 30. When corner portions of the memory chip 40 and the FOD layer 30 are particularly likely to be cracked, for example, the reinforcement members 50 are selectively disposed at these corner portions to prevent cracks effectively while reducing an amount of the reinforcement members 50.

In FIG. 9, the reinforcement members 50 are intermittently disposed along the outer edges of the memory chip 40 and the FOD layer 30 and form an islands structure (are in a dashed-line state). In this manner, the reinforcement members 50 may not be continuously disposed along the entire peripheral portions of the memory chip 40 and the FOD layer 30 but intermittently.

In FIG. 10, the reinforcement members 50 have a substantially circular dot shape and are disposed intermittently. Even such substantially circular reinforcement members 50 can prevent cracks.

It is noted that the size, shape, number, and position of the reinforcement members 50 are not limited to the modifications illustrated in FIGS. 8 to 10. The size, shape, number, and position of the reinforcement members 50 may be set in accordance with positions where cracks are apt to appear. The modifications illustrated in FIGS. 8 to 10 may be applied to the second embodiment.

(Second Modification) When the reinforcement member 50 is made of a semiconductor material such as silicon, for example, it is difficult in forming the reinforcement member 50 to deposit and process the material of the reinforcement member on the insulating layer 12. Therefore, in a second modification, the reinforcement member 50 preformed in a desired shape is adhered to the first surface F1 of the wiring board 10. Thus, as illustrated in FIG. 5A, the reinforcement member 50 can be disposed on the wiring board 10. Even the second modification produces substantially the same effects as the above-described embodiments.

(Third Modification) In the above-described embodiments, a plurality of memory chips 40 may be stacked.

(Fourth Modification) In the first and second embodiments, the controller chip 20 may be replaced, as the first element, with other semiconductor elements such as an interface or elements such as a capacitor. In such a case as well, substantially the same effects as the above-described embodiments can be obtained.

(Fifth Modification) In the above-described embodiments, the memory chip 40 may be replaced with a plate-shaped spacer, for example, as the second element, and the memory chip 40 may be disposed on the spacer. In this case as well, substantially the same effects as the above-described embodiments can be obtained. A material, such as silicon, glass, and resin, may be used for the spacer.

(Sixth Modification) In the manufacturing method according to the above-described embodiments, the memory chip 40 to which the FOD layer 30 is already adhered may be used. At this time, the memory chip 40 to which the FOD layer 30 is adhered is integrally disposed on the controller chip 20, the reinforcement member 50, and the bonding wire BW1. In this case as well, substantially the same effects as the above-described embodiments can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a wiring board having a first surface;
   a first element disposed on the first surface of the wiring board;
   a first resin layer that covers the first element;
   at least one second element larger than the first element and disposed on the first resin layer, the at least one second element being superposed above the first element;
   a third element disposed at a peripheral portion of the first resin layer and having at least one edge disposed inside of the first resin layer, the third element having an upper surface above the first surface of the wiring board, the third element having a first coefficient of linear expansion lower than a second coefficient of linear expansion of the first resin layer; and
   an encapsulating resin material, over the first surface of the wiring board, that is configured to cover the first element, the at least one second element, the first resin layer, and the third element.

2. The semiconductor device according to claim 1, wherein the third element has a thickness in a range from a first value substantially equal to a thickness of the first element to a second value substantially equal to a thickness of the first resin layer.

3. The semiconductor device according to claim 1, wherein the third element is disposed at a first position relative to a position on the first surface corresponding to an outer edge of the at least one second element toward the first element by a lateral distance substantially equal to the thickness of the first resin layer.

4. The semiconductor device according to claim 3, wherein a first edge of the third element is between the first position and the first element and inside the first resin layer, and a second edge of the third element is between the first position and an outer edge of the first resin layer and inside the first resin layer.

5. The semiconductor device according to claim 3, wherein a first edge of the third element is between the first position and the first element and inside the first resin layer, and a second edge of the third element is exposed by an outer edge of the first resin layer.

6. The semiconductor device according to claim 1, wherein the third element comprises a first material the same as a second material of an insulating layer configured to overlay one or more wiring layers of the wiring board.

7. The semiconductor device according to claim 1, wherein the third element is disposed along an outer edge of the first resin layer.

8. The semiconductor device according to claim 1, wherein the third element is disposed along an outer edge of the at least one second element.

9. The semiconductor device according to claim 1, wherein the third element incudes a material selected from at least one of a solder resist, a photosensitive solder, a resin material, or silicon.

10. The semiconductor device according to claim 1, wherein the third element is continuously disposed along an outer edge of the first resin layer.

11. The semiconductor device according to claim 1, wherein the third element is disposed around a corner of an outer edge of the first resin layer.

12. The semiconductor device according to claim 1, wherein the third element is intermittently disposed along an outer edge of the first resin layer.

13. The semiconductor device according to claim 1, wherein the third element is substantially circular.

14. The semiconductor device according to claim 1, wherein the third element is made of a resin material.

15. The semiconductor device according to claim 1, further comprising;
- a first wire connecting the second element and the wiring board,
- wherein the encapsulating resin material is over the first wire.

16. The semiconductor device according to claim 1, wherein an outer edge of the first resin layer is located outside an outer edge of at least one of the second elements.

* * * * *